(12) United States Patent
Kim et al.

(10) Patent No.: US 8,284,880 B2
(45) Date of Patent: Oct. 9, 2012

(54) CLOCK DATA RECOVERY CIRCUIT AND METHOD FOR OPERATING THE SAME

(75) Inventors: Kyung-Hoon Kim, Kyoungki-do (KR); Jong-Ho Kang, Kyoungki-do (KR); Yong-Ki Kim, Kyoungki-do (KR); Dae-Han Kwon, Kyoungki-do (KR); Sang-Yeon Byeon, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 1044 days.

(21) Appl. No.: 12/005,850

(22) Filed: Dec. 28, 2007

(65) Prior Publication Data

US 2009/0116601 A1 May 7, 2009

(30) Foreign Application Priority Data

Nov. 2, 2007 (KR) .................. 10-2007-0111492

(51) Int. Cl.
*H04L 7/00* (2006.01)

(52) U.S. Cl. ......... 375/354; 375/355; 375/356; 375/371

(58) Field of Classification Search .................. 375/354, 375/371, 355, 356; 714/12; 327/141; 370/503
See application file for complete search history.

(56) References Cited

U.S. PATENT DOCUMENTS

| | | | | |
|---|---|---|---|---|
| 5,097,489 A | * | 3/1992 | Tucci | 375/374 |
| 5,134,637 A | * | 7/1992 | Beyer et al. | 375/357 |
| 5,923,188 A | * | 7/1999 | Kametani et al. | 326/93 |
| 6,094,082 A | * | 7/2000 | Gaudet | 327/270 |
| 6,768,690 B2 | * | 7/2004 | Kwon et al. | 365/194 |
| 6,901,126 B1 | * | 5/2005 | Gu | 375/355 |
| 7,051,227 B2 | * | 5/2006 | Kazachinsky et al. | 713/500 |
| 7,206,370 B2 | | 4/2007 | Nakao | |
| 7,257,183 B2 | | 8/2007 | Dally et al. | |
| 7,349,506 B2 | * | 3/2008 | Shizuki | 375/350 |
| 7,548,101 B2 | * | 6/2009 | Shim | 327/175 |
| 7,633,322 B1 | * | 12/2009 | Zhuang et al. | 327/156 |
| 7,696,829 B2 | * | 4/2010 | Henzler et al. | 331/17 |
| 2002/0057118 A1 | * | 5/2002 | Tang | 327/158 |
| 2004/0208270 A1 | | 10/2004 | Schmatz et al. | |
| 2007/0036020 A1 | | 2/2007 | Lee et al. | |

FOREIGN PATENT DOCUMENTS

KR 1020070026079 3/2007

* cited by examiner

*Primary Examiner* — Shuwang Liu
*Assistant Examiner* — Helene Tayong
(74) *Attorney, Agent, or Firm* — Blakely, Sokoloff, Taylor & Zafman

(57) ABSTRACT

A clock data recovery (CDR) circuit occupies a small area required in a high-integration semiconductor device, electronic device and system and is easy in design modification. The CDR circuit includes a digital filter configured to filter phase comparison result signals received during predetermined periods and output control signals, a driver configured to control the digital filter by adjusting the predetermined periods, and an input/output circuit configured to recognize an input and output of data and clock in response to the control signals.

18 Claims, 6 Drawing Sheets

US 8,284,880 B2

CLOCK DATA RECOVERY CIRCUIT AND METHOD FOR OPERATING THE SAME

CROSS-REFERENCE TO RELATED APPLICATIONS

The present invention claims priority of Korean patent application number 10-2007-0111492, filed on Nov. 2, 2007, which is incorporated by reference in its entirety.

BACKGROUND OF THE INVENTION

The present invention relates to a high-speed semiconductor memory device, and more particularly to a clock data recovery (CDR) circuit, which can recover a distortion occurring during high-speed signal and data processing within a semiconductor memory device and a method for operating the same.

In a system with a variety of semiconductor devices, a semiconductor memory device serves as data storage. The semiconductor memory device outputs data corresponding to an address received from a data processor, e.g., a central processing unit (CPU), or stores data received from the data processor into unit cells selected by an address inputted together with the data.

As the operating speed of the system is increasing and a semiconductor integration technology advances, the data processor requires the semiconductor memory device to input/output data at higher speed. In order for the semiconductor memory device to operate faster and more stably, a variety of internal circuits must be able to operate at high speed and transfer signals or data therebetween at high speed.

To apply the semiconductor memory device to high-speed systems, an interface speed for signal or data transfer has also increased. A clock data recovery (CDR) method is used in the semiconductor memory device in order to prevent malfunction and unstable operation caused by signal or data distortion due to noise or interference during an interface operation.

To obtain reliability in transferring signals or data at high speed, the semiconductor memory device uses a CDR circuit. The CDR technology is essentially adopted in high-performance systems and recovers data and clock that were distorted or changed upon transmission by noise and interference.

The transmission of data and clock may be delayed for several reasons on data and clock transmission paths within the semiconductor memory device. This delay obstructs the process of receiving data and clock and performing corresponding operations, resulting in malfunction of the semiconductor memory device. To prevent the malfunction of the semiconductor memory device, internal circuits of the semiconductor memory device perform their internal operations in synchronization with an external reference clock. Thus, when a phase of the reference clock does not coincide with a phase of an internal clock used in the internal operations, the internal circuits of the semiconductor memory device must be controlled according to the detection result of the phase difference. For example, the phase of the internal clock is changed, or the internal circuits perform their internal operations as a current state of the internal clock is considered.

The CDR circuit includes a phase comparator for detecting a phase difference between the reference clock and the internal clock, and a filter for filtering the detected phase difference to output the detection result.

FIG. 1 is a block diagram of a conventional CDR circuit.

Referring to FIG. 1, the CDR circuit includes a phase comparator 110 and a digital filter 100. The digital filter 100 includes a lagging digital filter 100A and a leading digital filter 100B.

The phase comparator 110 compares a phase of an external reference clock REF with a phase of a feedback clock FB used for controlling an internal operation. The phase comparator 110 outputs a phase leading signal PD_EARLY when the phase of the feedback clock FB leads the phase of the reference clock REF, and outputs a phase lagging signal PD_LATE when the phase of the feedback clock FB lags behind the phase of the reference clock REF.

More specifically, the lagging digital filter 100A receives the phase lagging signal PD_LATE for predetermined periods and outputs a lagging state signal LATE when the phase of the feedback clock FB continue to lag behind the phase of the reference clock REF for a predetermined time. The leading digital filter 100B receives the phase leading signal PD_EARLY for predetermined periods and outputs a leading signal EARLY when the phase of the feedback clock FB continue to lead the phase of the reference clock REF for a predetermined time.

The lagging digital filter 100A includes a lagging adder 120A, a first state holding unit 140A, and a lagging determining unit 160A. The leading digital filter 100B includes a leading adder 120B, a second state holding unit 140B, and a leading determining unit 160B. Since an internal structure of the lagging digital filter 100A is similar to that of the leading digital filter 100B, the following description will be focused on the lagging digital filter 100A.

The lagging adder 120A adds the phase lagging signals PD_LATE received for predetermined periods. In this embodiment, the lagging adder 120A is implemented with a 3-bit adder that adds the phase lagging signals PD_LATE received for 8 periods of the reference clock REF. The first state holding unit 140A receives a lagging sum signal SUM_LATE<0:2> corresponding to an addition result of the lagging adder 120A and feeds back a lagging information signal LATE_COM<0:2> to the lagging adder 120A in response to the reference clock REF. When the addition of the phase lagging signals PD_LATE received for 8 periods of the reference clock REF is completed, the lagging determining unit 160A outputs the lagging state signal LATE according to the lagging information signal LATE_COM<0:2>.

FIG. 2A is a circuit diagram of the phase comparator 110 of FIG. 1.

Referring to FIG. 2A, the phase comparator 110 may be implemented with a flip-flop. The flip-flop outputs the phase lagging signal PD_LATE or the phase leading signal PD_EARLY according to the phases of the feedback clock FB and the reference clock REF.

FIG. 2B is a block diagram of the lagging adder 120A of FIG. 1.

Referring to FIG. 2B, the lagging adder 120A includes three 1-bit adders 122, 124 and 126. The lagging adder 120A sums the phase lagging signals PD_LATE successively received eight times to output the lagging sum signal SUM_LATE<0:2>. Reference symbols CA1 and CA2 outputted from the adders 122 and 124 represent a carry. Since the lagging adder 120A for summing the 3-bit signal and the 1-bit signal, that is, the lagging information signal LATE_COM<0:

2> and the phase lagging signal PD_LATE, is well known to those skilled in the art, detailed description thereof will be omitted.

FIG. 2C is a circuit diagram of the first state holding unit 140A of FIG. 1.

Referring to FIG. 2C, the first state holding unit 140A includes three flip-flops 142, 144 and 146. The flip-flops 142, 144 and 146 receive respective bits of the lagging sum signal SUM_LATE<0:2> to output the respective lagging information signals LATE_COM<0:2> in response to the reference clock REF.

Although not shown in detail, the leading digital filter 100B includes a leading adder 120B, a second state holding unit 140B, and a leading determining unit 160B. The leading adder 120B is implemented with a 3-bit adder that adds the phase leading signals PD_EARLY received for 8 periods of the reference clock REF. The second state holding unit 140B receives a leading sum signal SUM_EARLY<0:2> corresponding to an addition result of the leading adder 120B and feeds back a leading information signal EARLY_COM<0:2> to the leading adder 120B in response to the reference clock REF. When the addition of the phase leading signals PD_EARLY received for 8 periods of the reference clock REF is completed, the leading determining unit 160B outputs the leading state signal EARLY according to the leading information signal EARLY_COM<0:2>.

When the phase lagging signal PD_LATE or the phase leading signal PD_EARLY successively occurs more than a predetermined frequency for eight periods of the reference clock REF, the lagging determining unit 160A and the leading determining unit 160B determine that the respective signals are valid, and output the lagging state signal LATE or the leading state signal EARLY. The lagging state signal LATE and the leading state signal EARLY are used to control the CDR operation. For example, when one of the lagging state signal LATE and the leading state signal EARLY is activated, the CDR circuit operates according to the activated signal. When both of the lagging state signals LATE and the leading state signal EARLY are activated, the CDR circuit holds the current state without further adjustment.

Although it has been described in the above embodiment that the digital filter 100 outputs the lagging state signal LATE and the leading state signal EARLY with respect to eight periods of the reference clock REF, the present invention is not limited thereto. For example, if the digital filter 100 operates on the basis of 16 periods, the digital filter 100 may be implemented with a larger number of the adders and flip-flops in the lagging and leading adders 120A and 120B, and the first and second state holding units 140A and 140B respectively.

In the CDR circuit, the digital filter 100 for filtering the comparison results outputted from the phase comparator 110 in order to output the lagging state signal LATE and the leading state signal EARLY is implemented with a plurality of adders and a plurality of flip-flops as described above. Such an implementation demands a lot of transistors, resulting in increase in a size of the CDR circuit. That is, the digital filter 100 will occupy a large area in the semiconductor memory device.

As the integration density of semiconductor memory devices increases, many efforts have been made to scale down a peripheral region controlling and executing the data input and output as well as a core region including a plurality of cells storing data. However, since the conventional digital filter occupies a very large area, there is a limitation in adopting it in the high-integration semiconductor memory device.

Further, even though the conventional digital filter is adopted, it will impose a significant burden on a design of the high-integration semiconductor memory device.

SUMMARY OF THE INVENTION

Embodiments of the present invention are directed to providing a CDR circuit, which occupies a small area in a high-integration semiconductor device, electronic device and system and is easy in design modification.

In accordance with an aspect of the present invention, there is provided a semiconductor memory device which includes a storage configured to store data, a phase comparator configured to compare a phase of a reference clock with a phase of an internal clock to output phase comparison result signals, a digital filter configured to filter the phase comparison result signals received during predetermined periods to output control signals, a driver configured to control the digital filter by adjusting the predetermined periods, and an interface configured to transfer data and signals corresponding to an external command to the storage in response to the control signals.

In accordance with another aspect of the present invention, there is provided a clock data recovery circuit which includes a digital filter configured to filter phase comparison result signals received during predetermined periods and output control signals, a driver configured to control the digital filter by adjusting the predetermined periods, and an input/output circuit configured to recognize an input and output of data and clock in response to the control signals.

In accordance with a third aspect of the present invention, there is provided a digital filtering circuit which includes a digital filter configured to filter input signals during predetermined periods by using a latch and output control signals, and a driver configured to determine the predetermined periods and receive a clock for controlling the latch of the digital filter to output an enable signal in a pulse form.

In accordance with a fourth aspect of the present invention, there is provided a method for operating a clock data recovery circuit, the method including filtering phase comparison result signals inputted during predetermined periods and outputting control signals for controlling a clock data recovery operation, controlling the predetermined periods through a division of a reference clock and outputting an enable signal for controlling an output of the control signals, and recognizing an input and output of data and clock in response to the control signals.

In accordance with a fifth aspect of the present invention, there is provided a method for operating a semiconductor memory device which includes storing data, comparing a phase of a reference clock with a phase of an internal clock to output phase comparison result signals, generating control signals by filtering the phase comparison result signals inputted during predetermined periods, controlling the predetermined periods through a division of the reference clock and outputting an enable signal for controlling an output of the control signals, and transferring data and signals corresponding to an external command in response to the control signals.

To meet a small area requirement for high-integration semiconductor memory device, electronic devices and systems, a plurality of adders are eliminated in a digital filter for filtering phase comparison result, and the number of flip-flops is reduced. Further, the number of the adders and flip-flops in the digital filter dose not vary according to the predetermined periods during which the phase comparison result is filtered, but a driver controlling the digital filter, which is additionally provided, determines the predetermined periods.

DESCRIPTION OF SPECIFIC EMBODIMENTS

Hereinafter, a clock data recovery circuit and a method for operating the same in accordance with the present invention will be described in detail with reference to the accompanying drawings.

Figure 3:
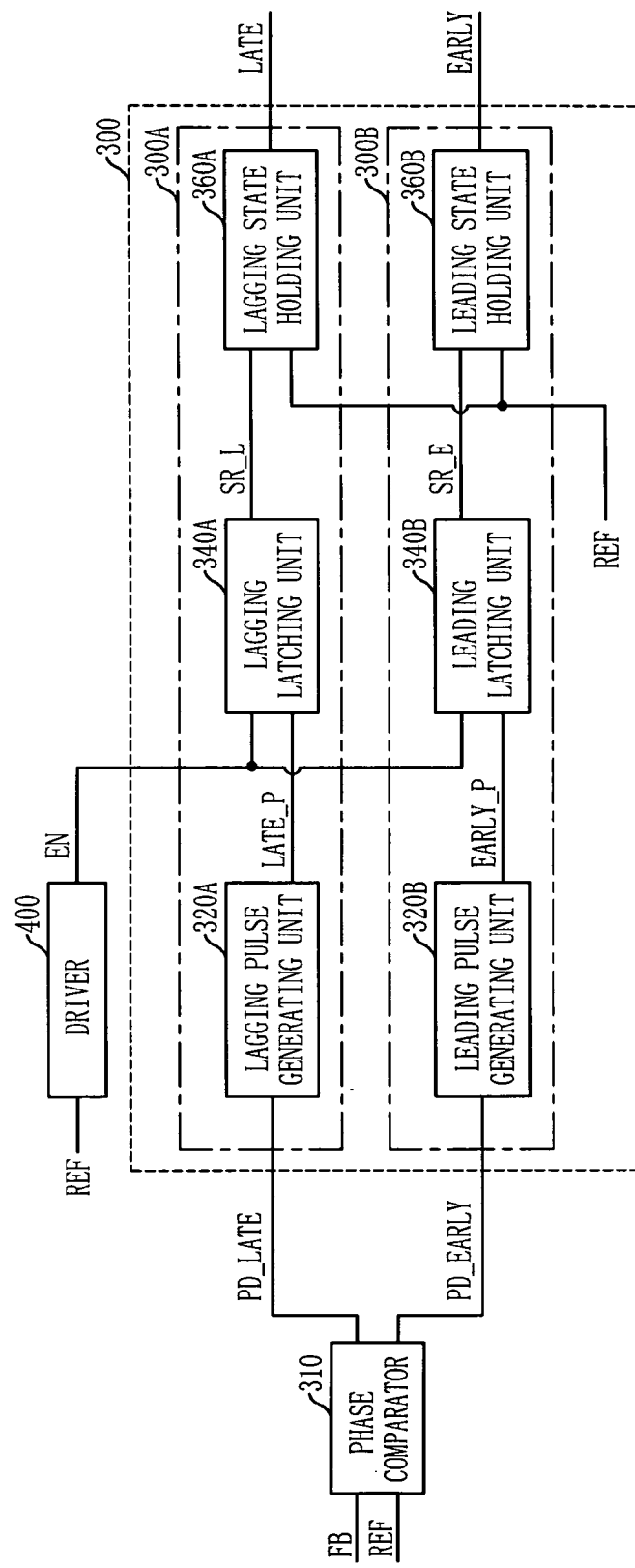
FIG. 3 is a block diagram of a semiconductor memory device in accordance with an embodiment of the present invention.

FIG. 3 is a block diagram of a semiconductor memory device in accordance with an embodiment of the present invention.

Referring to FIG. 3, the semiconductor memory device includes a phase comparator 310, a digital filter 300, and a driver 400.

The phase comparator 310 compares a phase of a reference clock REF with a phase of an internal clock FB to output phase comparison result signals to the digital filter 300. The digital filter 300 filters the phase comparison result signals received for predetermined periods and outputs control signals. The driver 400 determines the predetermined periods in response to the reference clock REF and controls the digital filter 300.

The phase comparator 310 performs the same function as the phase comparator 110. The phase comparator 310 compares the external reference clock REF with the internal clock FB used for controlling an internal operation. The phase comparator 310 outputs a phase lagging signal PD_LATE when the phase of the internal clock FB lags behind the phase of the reference clock FB, and outputs a phase leading signal PD_EARLY when the phase of the internal clock FB leads the phase of the reference clock REF.

Figure 1:
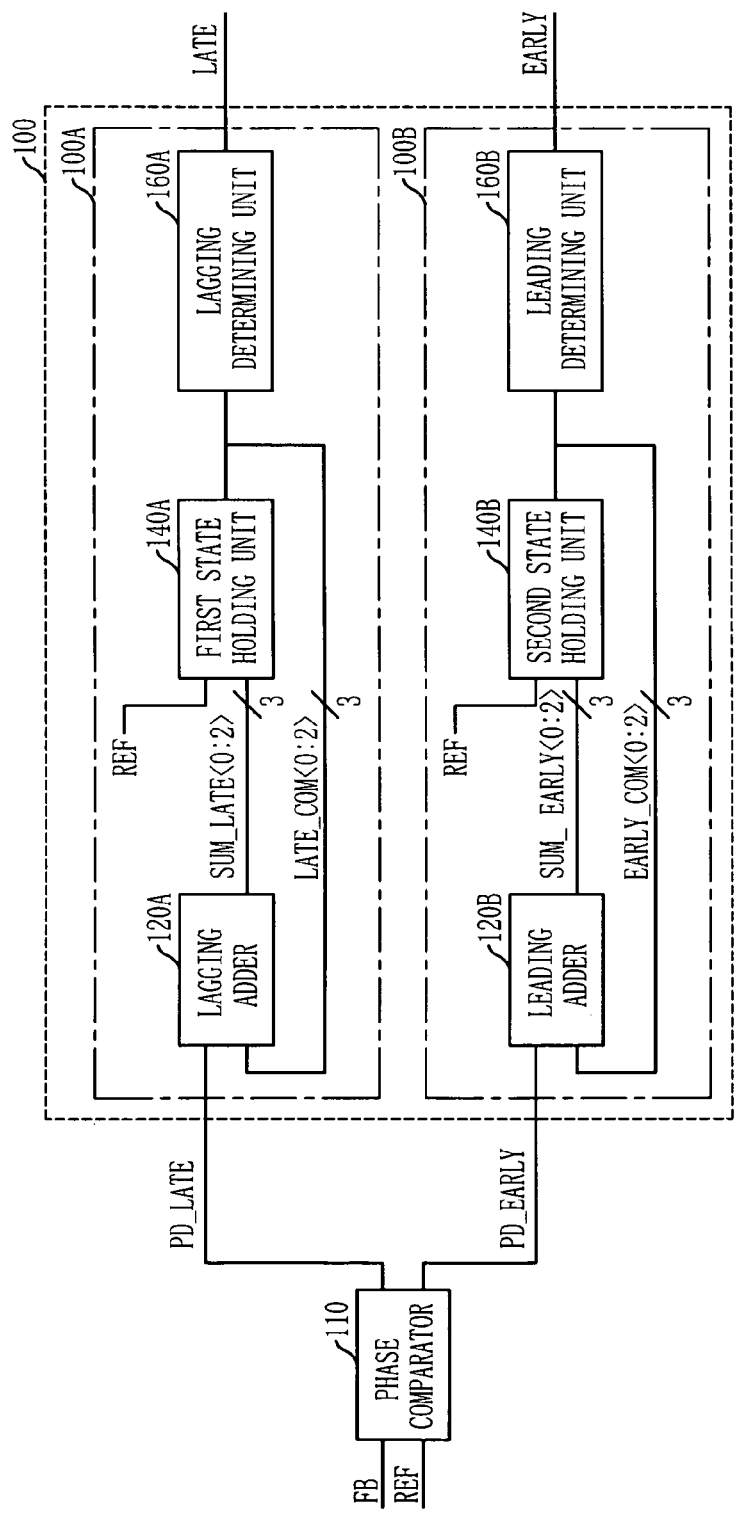
FIG. 1 is a block diagram of a conventional CDR circuit.
Figure 2A:
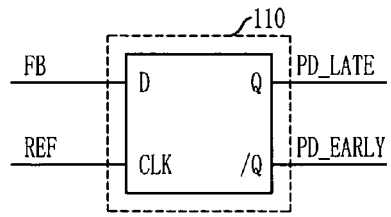
FIG. 2A is a circuit diagram of a phase comparator of FIG. 1.
Figure 2B:
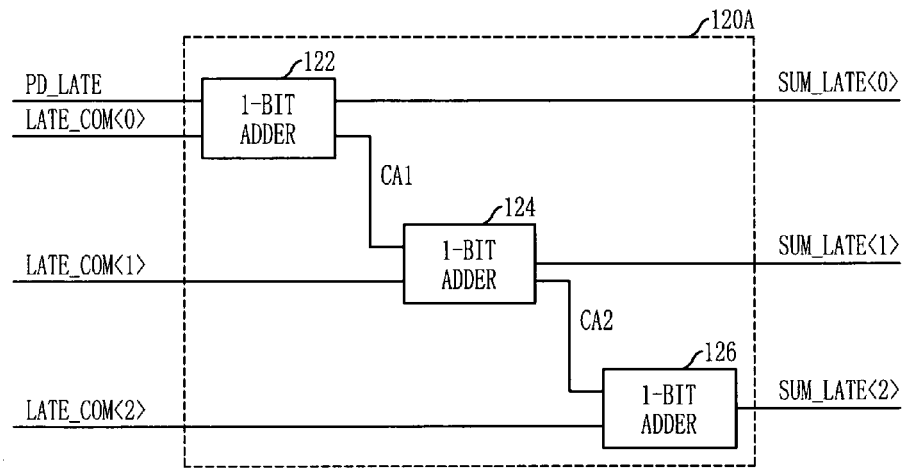
FIG. 2B is a block diagram of a lagging adder of FIG. 1.
Figure 2C:
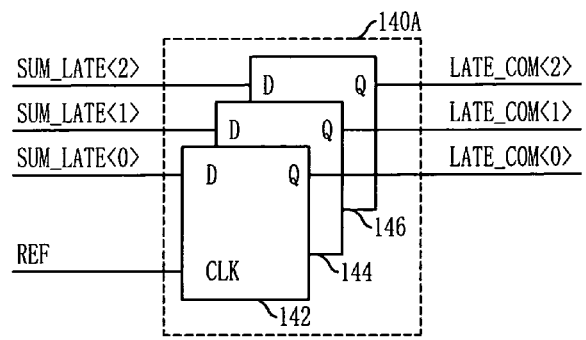
FIG. 2C is a circuit diagram of the first state holding unit 140A of FIG. 1.

The digital filter 300 includes a lagging digital unit filter 300A and a leading digital unit filter 300B. The digital filter 300 differs from the conventional digital filter 100 of FIG. 1 in that it is controlled by the driver 400.

More specifically, the lagging digital unit filter 300A receives the phase lagging signal PD_LATE and outputs a lagging state signal LATE when the phase of the internal clock FB continue to lag behind the phase of the reference clock REF for predetermined periods. The leading digital unit filter 300B receives the phase leading signal PD_EARLY and outputs a leading signal EARLY when the phase of the internal clock FB continues to lead the phase of the reference clock REF for predetermined periods.

The driver 400 divides the reference clock REF by a preset division ratio so that the lagging digital unit filter 300A and the leading digital unit filter 300B can output the lagging state signal LATE and the leading state signal EARLY every predetermined interval. Thereafter, the divider 400 uses the divided clock to generate an enable signal EN in a pulse form to the digital filter 300.

The semiconductor memory device delays the CDR operation when the lagging state signal LATE outputted from the digital filter 300 is activated, and it advances the CDR operation when the leading state signal EARLY is activated. Further, the semiconductor memory device holds the CDR operation as the current state when both of the lagging state signal LATE and the leading state signal EARLY are activated.

Although not shown, the semiconductor memory device includes a plurality of data storages, for example, a plurality of banks. Further, the semiconductor memory device includes interface circuits for transferring data or signals corresponding to the external command to the storages according to the lagging state signal LATE and the leading state signal EARLY. When the CDR circuit in accordance with the embodiment of the present invention is applied to high-speed network devices, the lagging state signal LATE and the leading state signal EARLY can be also supplied to the data/signal input/output circuits.

In accordance with the embodiment of the present invention, since the driver 400 determines the predetermined periods during which the phase of the internal clock FB and the phase of the reference clock REF are compared, the internal structure and circuit area of the digital filter 300 are not changed even though the predetermined periods vary. Therefore, the number of adders and flip-flops does not increase and the semiconductor memory device can be implemented at a small circuit area, which is required by high-integration semiconductor memory device and system.

As described above, the digital filter 300 includes the lagging digital unit filter 300A configured to output the lagging state signal LATE in response to the enable signal EN outputted from the driver 400, and the leading digital unit filter 300B configured to output the leading state signal EARLY in response to the enable signal EN outputted from the driver 400.

More specifically, the lagging digital unit filter 300A includes a lagging pulse generating unit 320A, a lagging latching unit 340A, and a lagging state holding unit 360A. The lagging pulse generating unit 320A receives the output signal of the phase comparator 310 to output a lagging pulse LATE_P. The lagging latching unit 340A latches the lagging pulse LATE_P in response to the enable signal EN. The lagging state holding unit 360A outputs the output value of the lagging latching unit 340A as the lagging state signal LATE in response to the reference clock REF. The leading digital unit filter 300B includes a leading pulse generating unit 320B, a leading latching unit 340B, and a leading state holding unit 360B. The leading pulse generating unit 320B receives the output signal of the phase comparator 310 to output a leading pulse EARLY_P. The leading latching unit 340B latches the leading pulse EARLY_P in response to the enable signal EN. The leading state holding unit 360B outputs the output value of the leading latching unit 340B as the leading state signal EARLY in response to the reference clock REF.

Since an internal structure and an operation of the lagging digital unit filter 300A are similar to those of the leading digital unit filter 300B, the following description will be focused on the lagging digital unit filter 300A.

Figure 4A:
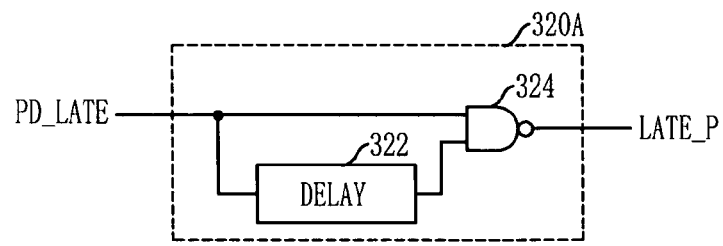
FIGS. 4A and 4B are circuit diagrams of a lagging pulse generating unit of FIG. 3.
Figure 4B:
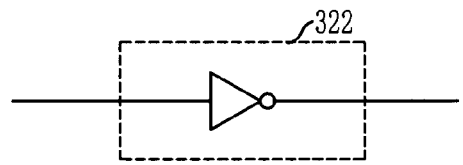

FIGS. 4A and 4B are circuit diagrams of the lagging pulse generating unit 320A of FIG. 3.

Referring to FIG. 4A, the lagging pulse generating unit 320A includes a delay 322 configured to delay an input signal, and a logic gate 324 configured to receive the input signal and an output signal of the delay 322 to generate the lagging pulse LATE_P. More specifically, the delay 322 delays the phase lagging signal PD_LATE outputted from the phase comparator 310, and the logic gate 324 performs a NAND operation on the phase lagging signal PD_LATE and the output signal of the delay 322 to generate the lagging pulse LATE_P.

An oscillator with a plurality of elements connected in a feedback loop is widely used to generate the pulse-shaped signal. Since the lagging pulse generating unit 320A must process the phase lagging signal PD_LATE without phase delay, it is preferable to use the delay 322 and the logic gate 324 instead of the feedback loop type oscillator.

Referring to FIG. 4B, the delay 322 includes one inverter. A delay value of the inverter becomes a pulse width of the lagging pulse LATE_P. In another embodiment, the delay 322 may include a plurality of inverters. However, the number of the inverters must be odd when the logic gate 324 is implemented with a NAND gate. Consequently, the lagging pulse LATE_P is generated in the pulse-shaped signal although it is an inverted pulse form.

Figure 5:
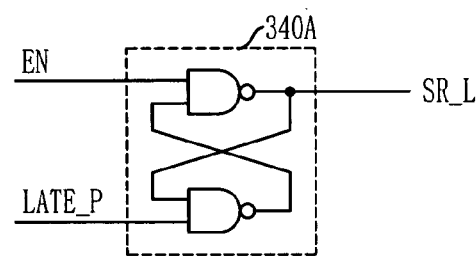
FIG. 5 is circuit diagram of a lagging latching unit of FIG. 3.

FIG. 5 is circuit diagram of the lagging latching unit 340A of FIG. 3.

Referring to FIG. 5, the lagging latching unit 340A includes a first NAND gate configured to receive the enable signal EN, and a second NAND gate configured to receive the lagging pulse LATE_P. An output terminal of the first NAND gate is connected to an input terminal of the second NAND gate, and an output terminal of the second NAND gate is connected to an input terminal of the first NAND gate. Hence, the first and second NAND gates construct a latch. The lagging latching unit 340A changes a latch value SR_L according to the enable signal EN corresponding to predetermined periods and the lagging pulse LATE_P and outputs it to the lagging state holding unit 360A.

Figure 6:
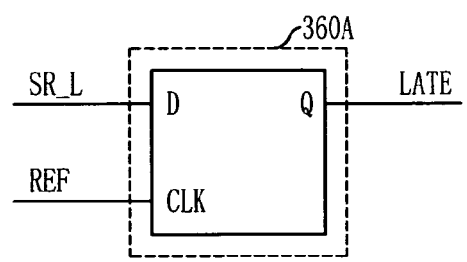
FIG. 6 is a circuit diagram of a lagging state holding unit of FIG. 3.

FIG. 6 is a circuit diagram of the lagging state holding unit 360A of FIG. 3.

Referring to FIG. 6, the lagging state holding unit 360A includes one flip-flop. More specifically, the lagging state holding unit 360A outputs the output signal SR_L of the lagging latching unit 340A in response to the reference clock REF.

Figure 7A:
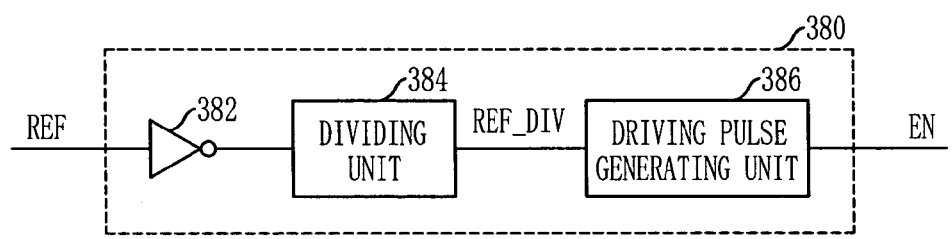
FIGS. 7A and 7B are circuit diagrams of a driver of FIG. 3.
Figure 7B:
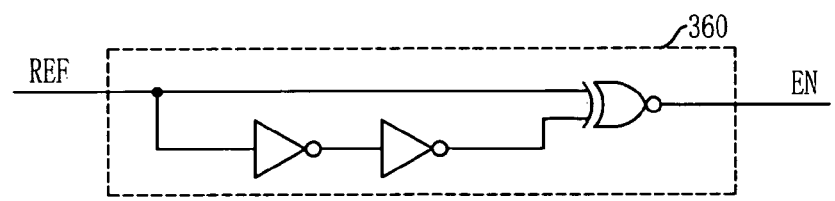

FIGS. 7A and 7B are circuit diagrams of the driver 400 of FIG. 3.

Referring to FIG. 7A, the driver 400 includes a dividing unit 384 configured to receive the reference clock REF to determine the predetermined periods during which the digital filter 300 determines the phase lagging or leading, and a driving pulse generating unit 386 configured to output the enable signal EN in a pulse form in response to an output signal REF_DIV of the dividing unit 384. The driver 400 may further include a buffer configured to buffer the reference clock REF. In this embodiment, the buffer is implemented with one inverter.

The dividing unit 384 can adjust the division ratio of the reference clock REF according to operation environments of the semiconductor memory device. For example, the dividing unit 384 divides the reference clock REF by the division ratio of 4:1, 8:1, or 16:1. In other words, the dividing unit 384 generates a signal REF_DIV having a period corresponding to four periods, eight periods or sixteen periods of the reference clock REF according to the division ratio of 4:1, 8:1, or 16:1. The signal REF_DIV is transferred to the driving pulse generating unit 386.

Referring to FIG. 7B, the driving pulse generating unit 386 includes a delay element configured to delay an input signal, and a logic gate configured to generate a pulse by using the input signal and the output signal of the delay element. The driving pulse generating unit 386 has a structure different from that of the lagging pulse generating unit 320A illustrated in FIGS. 4A and 4B. The delay element of the driving pulse generating unit 386 is implemented with an even number of inverters connected in series. The logic gate is implemented with an exclusive NOR (XNOR) gate. The enable signal EN outputted from the driving pulse generating unit 386 has an inverted pulse form.

As described above, the driver 400 is separately provided for controlling the digital filter 300, and the predetermined periods during which the lagging state signal LATE and the leading state signal EARLY are outputted are controlled using the dividing unit 384 of the driver 400. Therefore, in the conventional CDR circuit, the number of the adders and flip-flops in the digital filter 100 is determined according to the predetermined periods during which the lagging state signal LATE and the leading state signal EARLY are outputted. However, in accordance with the embodiment of the present invention, the design of the semiconductor memory device can be easily and conveniently modified according to operation environments. Further, the adders used in the related art are eliminated and the number of the flip-flops is reduced. Thus, the CDR circuit in accordance with the embodiment of the present invention can be applied to high-integration semiconductor memory devices and high-integration system circuits. Moreover, the area of the semiconductor memory device or the system circuit can be reduced and the power consumption can be reduced.

Figure 8A:
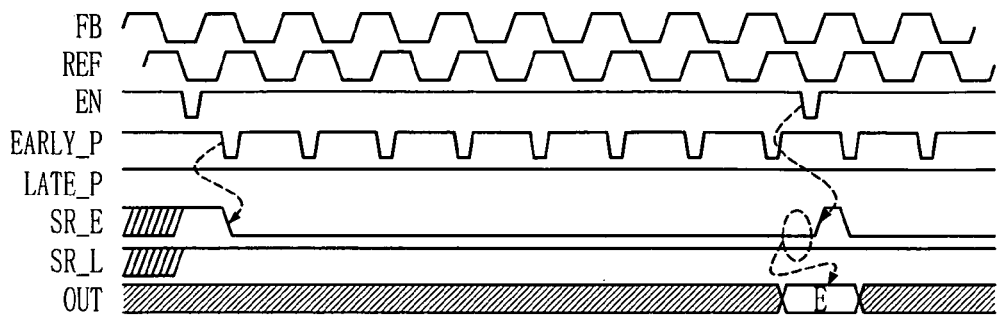
FIGS. 8A to 8C are timing diagrams illustrating the operation of the semiconductor memory device of FIG. 3.
Figure 8B:
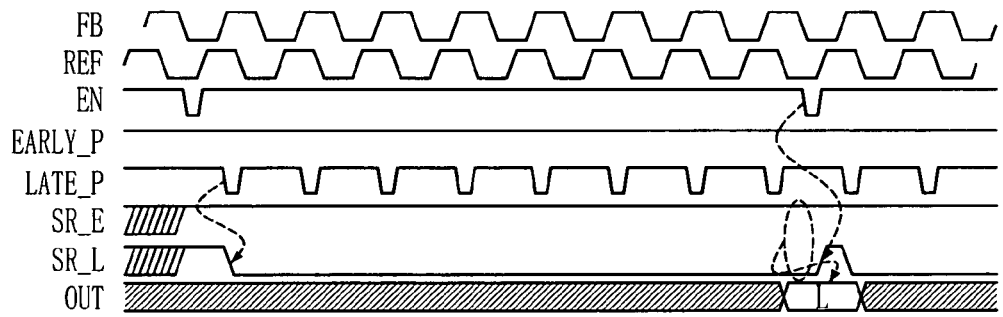
Figure 8C:
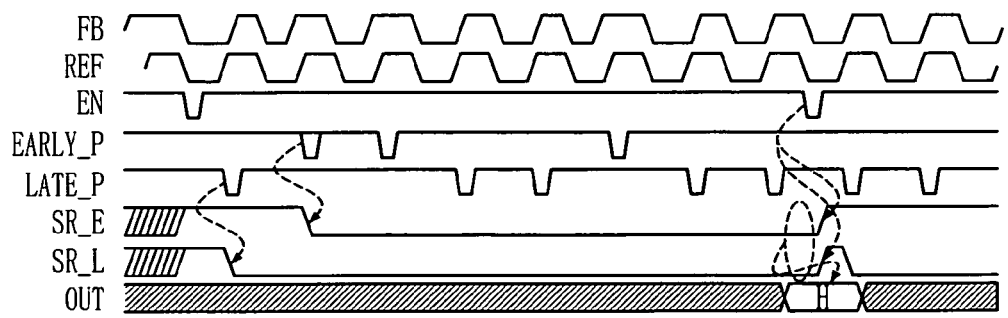

FIGS. 8A to 8C are timing diagrams illustrating the operation of the semiconductor memory device of FIG. 3. Respective cases of signal waveforms according to the phase comparison results of the internal clock FB and the reference clock REF are illustrated in FIGS. 8A to 8C. In each case, the predetermined period of the lagging state signal LATE and the leading state signal EARLY is eight periods of the reference clock REF.

Specifically, FIG. 8A illustrates a case where the phase of the internal clock FB leads the phase of the reference clock REF during the predetermined periods. The phase of the internal clock FB always leads the phase of the reference clock REF during eight periods of the reference clock REF. The leading pulse generating unit 320B of the leading digital unit filter 300B generates the leading pulse EARLY_P according to the phase leading signal PD_EARLY outputted from the phase comparator 310. The enable signal EN is activated in every eight periods of the reference clock REF and inputted to the leading digital unit filter 300B. Consequently, the leading digital unit filter 300B activates the leading state signal EARLY. During these operations, the phase of the internal clock FB does not lag behind the phase of the reference clock REF. Therefore, the lagging pulse generating unit 320A of the lagging digital unit filter 300A does not activate the lagging pulse LATE_P, and the lagging digital unit filter 300A does not activate the lagging state signal LATE.

FIG. 8B illustrates a case where the phase of the internal clock FB lags behind the phase of the reference clock REF during the predetermined periods. This case is opposite to the case of FIG. 8A. The phase of the internal clock FB always lags behind the phase of the reference clock REF during eight periods of the reference clock REF. The lagging pulse generating unit 320A of the lagging digital unit filter 300A generates the lagging pulse LATE_P according to the phase lagging signal PD_LATE outputted from the phase comparator 310.

Consequently, the lagging digital unit filter 300A activates the lagging state signal LATE, and the leading digital unit filter 300B does not activate the leading state signal EARLY.

FIG. 8C illustrates a case where the phase of the internal clock FB repetitively leads and lags behind the phase of the reference clock REF during the predetermined periods. In this case, the phase comparator 310 outputs the phase lagging signal PD_LATE and the phase leading signal PD_EARLY, and the lagging digital unit filter 300A and the leading digital unit filter 300B of the digital filter 300 activate the lagging state signal LATE and the leading state signal EARLY, respectively.

As described above, the semiconductor memory device delays the CDR operation only when the lagging state signal LATE is activated, and advances the CDR operation only when the leading state signal EARLY is activated. Reference symbols E and L of a waveform OUT illustrated in FIGS. 8A and 8B represent these cases respectively. Further, referring to a reference symbol H in FIG. 8C, the semiconductor memory holds the CDR operation as the current state when both of the lagging state signal LATE and the leading state signal EARLY are activated.

The digital filter 300 and the driver 400 can be used in other electronic devices as well as clock or data recovery devices. For example, the digital filter and the driver can filter other input signals, instead of the phase comparison result signals.

In accordance with the embodiments of the present invention, the CDR circuit can be designed to reduce internal components of the filter outputting the phase comparison result. Thus, the CDR circuit can be provided at a small area within high-integration semiconductor memory devices and high-integration electronic devices and systems. Consequently, this can realize the high integration of the semiconductor memory device and the electronic devices and systems.

Further, the operation of the filter filtering the phase comparison result can be controlled through the design modification of the driver. Therefore, the design of the CDR circuit can be easily modified according to operation environments of the high-integration semiconductor memory device and the high-integration electronic devices and systems.

Furthermore, the semiconductor memory device or the electronic device and system with the CDR in accordance with the present invention circuit can be highly integrated and their power consumption can be reduced because their internal components can be reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a storage configured to store data;
a phase comparator configured to compare a phase of a e reference clock with a phase of an internal clock to output phase comparison result signals;
a digital filter configured to filter the phase comparison result signals received during predetermined periods to output control signals;
a driver configured to control the digital filter by adjusting the predetermined periods, determining the predetermined periods and outputting an enable signal; and
an interface configured to transfer data and signals corresponding to an external command to the storage in response to the control signals,
wherein the digital filter is enabled in response to the enable signal from the driver,
wherein the digital filter is configured to output a lagging state signal when a state that the reference clock lags behind the internal clock occurs during the predetermined periods, and output a leading state signal when the state that the reference clock leads the internal clock occurs during the predetermined periods
wherein the digital filter includes:
a lagging digital unit filter configured to output the lagging state signal in response to the enable signal outputted from the driver; and
a leading digital unit filter configured to output the leading state signal in response to the enable signal outputted from the driver,
wherein the lagging digital unit filter includes:
a lagging pulse generating unit configured to receive the phase comparison result signals to generate lagging pulses;
a lagging latching unit configured to latch the lagging pulses in response to the enable signal; and
a lagging state holding unit configured to output an output value of the lagging latching unit as the lagging state signal in response to the reference clock.

2. The semiconductor memory device as recited in claim 1, wherein the leading digital unit filter includes:
a leading pulse generating unit configured to receive the phase comparison result signals to generate leading pulses;
a leading latching unit configured to latch the leading pulses in response to the enable signal; and
a leading state holding unit configured to output an output value of the leading latching unit as the leading state signal in response to the reference clock.

3. The semiconductor memory device as recited in claim 1, wherein the driver includes:
a dividing unit configured to divide the reference clock to determine the predetermined periods; and
a driving pulse generating unit configured to output the enable signal in the pulse form in response to an output signal of the dividing unit.

4. The semiconductor memory device as recited in claim 3, wherein the dividing unit is configured to divide the reference clock by a division ratio of 4:1, 8:1, or 16:1 according to operation environments of the semiconductor memory device.

5. A clock data recovery, circuit, comprising:
a digital filter configured to filter phase comparison result signals received during predetermined periods and output control signals;
a driver configured to control the digital filter by adjusting the predetermined periods, determining the predetermined periods and outputting an enable signal; and
an input and output circuit configured to selectively delay, advance or hold a clock data recovery operation,
wherein the digital filter is enabled in response to the enable signal from the driver, wherein the digital filter is configured to output a lagging state signal when a state that a reference clock lags behind an internal clock occurs during the predetermined periods, and output a leading state signal when the state that the reference clock leads the internal clock occurs during the predetermined periods,
wherein the digital filter includes:
a lagging digital unit filter configured to output the lagging state signal in response to the enable signal outputted from the driver; and a leading digital unit filter configured to output the leading state signal in response to the enable signal outputted from the driver, wherein the lagging digital unit filter includes:

a lagging pulse generating unit configured to receive the phase comparison result signals to generate lagging pulses;

a lagging latching unit configured to latch the lagging pulses in response to the enable signal; and a lagging state holding unit configured to output an output value of the lagging latching unit as the lagging state signal in response to the reference clock.

6. The clock data recovery circuit as recited in claim 5, further comprising a phase comparator configured to compare a phase of a reference clock with a phase of an internal clock to output the phase comparison result signals.

7. The clock data recovery circuit as recited in claim 5, wherein the input and output circuit delays the clock data recovery operation only when the lagging state signal is activated, advances the clock data recovery operation only when the leading state signal is activated, and holds the clock data recovery operation as a current state when both the lagging state signal and the leading state signal are activated.

8. The clock data recovery circuit as recited in claim 5, wherein the leading digital unit filter includes:

a leading pulse generating unit configured to receive the phase comparison result signals to generate leading pulses;

a leading latching unit configured to latch the leading pulses in response to the enable signal; and a leading state holding unit configured to output an output value of the leading latching unit as the leading state signal in response to the reference clock.

9. The clock data recovery circuit as recited in claim 5, wherein the driver includes:

a dividing unit configured to divide a reference clock to determine the predetermined periods; and a driving pulse generating unit configured to output an enable signal in the pulse form in response to an output signal of the dividing unit.

10. The clock data recovery circuit as recited in claim 9, wherein the dividing unit is configured to divide the reference clock by a division ratio of 4:1,8:1, or 16:1 according to operation environments of the semiconductor memory device.

11. A digital filtering circuit, comprising:

a digital filter configured to filter input signals during predetermined periods by using a latch and output control signals; and a driver configured to determine the predetermined periods and receive a clock for controlling the latch of the digital filter to output an enable signal in a pulse form, wherein the driver determines the predetermined periods and outputs the enable signal, wherein the digital filter is enabled in response to the enable signal from the driver, wherein the digital filter is configured to output a lagging state signal when a state that a reference clock lags behind an internal clock occurs during the predetermined periods, and output a leading state signal when the state that the reference clock leads the internal clock occurs during the predetermined periods wherein the digital filter includes:

a lagging digital unit filter configured to output the lagging state signal in response to the enable signal outputted from the driver; and a leading digital unit filter configured to output the leading state signal in response to the enable signal outputted from the driver, wherein the lagging digital unit filter includes:

a lagging pulse generating unit configured to receive the phase comparison result signals to generate lagging pulses;

a lagging latching unit configured to latch the lagging pulses in response to the enable signal; and a lagging state holding unit configured to output an output value of the lagging latching unit as the lagging state signal in response to the reference clock.

12. The digital filtering circuit as recited in claim 11, wherein the driver includes:

a dividing unit configured to divide the clock to determine the predetermined periods; and a driving pulse generating unit configured to output the enable signal in response to an output signal of the dividing unit.

13. The digital filtering circuit as recited in claim 11, wherein the digital filter further includes:

a pulse generating unit configured to generate pulses corresponding to the input signals; and a state holding unit configured to output an output value of the latch as the control signal in response to the reference clock, wherein the latch temporarily stores the pulses.

14. The digital filtering circuit as recited in claim 11, wherein the leading digital unit filter includes:

a leading pulse generating unit configured to receive the phase comparison result signals to generate leading pulses;

a leading latching unit configured to latch the leading pulses in response to the enable signal; and a leading state holding unit configured to output an output value of the leading latching unit as the leading state signal in response to the reference clock.

15. A semiconductor memory device, comprising:

a phase comparator configured to compare a phase of a reference clock with a phase of an internal clock to output phase comparison result signals;

a driver configured to control the digital filter by adjusting the predetermined periods and determine the predetermined periods and outputs an enable signal a digital filter configured to filter the phase comparison result signals received during predetermined periods to output control signals and be enabled in response to the enable signal from the driver;

wherein the digital filter includes:

a lagging pulse generating unit configured to receive a phase comparison result signals to generate lagging pulses;

a lagging latching unit configured to latch the lagging pulses in response to the enable signal;

a lagging state holding unit configured to output a lagging state signal in response to the reference clock;

a leading pulse generating unit configured to receive the phase comparison result signals to generate leading pulses; a leading latching unit configured to latch the leading pulses in response to the enable signal; and a leading state holding unit configured to output a leading state signal in response to the reference clock.

16. The semiconductor memory device as recited in claim 15, wherein the driver receives a clock to output the enable signal for controlling the lagging latching unit and the leading latching unit.

17. The semiconductor memory device as recited in claim 15, wherein the lagging state holding unit output the lagging state signal when a state that a reference clock lags behind the internal clock occurs during a predetermined periods.

18. The semiconductor memory device as recited in claim 15, wherein the leading state holding unit outputs the leading state signal when a state that the reference clock leads the internal clock occurs during a predetermined periods.

* * * * *